(12) United States Patent
Gupta

(10) Patent No.: US 10,771,073 B2
(45) Date of Patent: Sep. 8, 2020

(54) FREQUENCY SYNTHESIZER WITH DYNAMICALLY SELECTED LEVEL SHIFTING OF THE OSCILLATING OUTPUT SIGNAL

(71) Applicant: STMicroelectronics International N.V., Schiphol (NL)

(72) Inventor: Nitin Gupta, Kurukshetra (IN)

(73) Assignee: STMicroelectronics International N.V., Schiphol (NL)

( * ) Notice: Subject to any disclaimer, the term of this patent is extended or adjusted under 35 U.S.C. 154(b) by 0 days.

(21) Appl. No.: 16/696,247

(22) Filed: Nov. 26, 2019

(65) Prior Publication Data

US 2020/0186155 A1   Jun. 11, 2020

Related U.S. Application Data

(60) Provisional application No. 62/777,446, filed on Dec. 10, 2018.

(51) Int. Cl.
| | | |
|---|---|---|
| *H03L 7/099* | (2006.01) | |
| *H03L 7/10* | (2006.01) | |
| *H03L 7/087* | (2006.01) | |

(52) U.S. Cl.
CPC ............ *H03L 7/0995* (2013.01); *H03L 7/087* (2013.01); *H03L 7/101* (2013.01)

(58) Field of Classification Search
USPC .................................................. 331/57, 186
See application file for complete search history.

(56) References Cited

U.S. PATENT DOCUMENTS

| | | | |
|---|---|---|---|
| 5,382,921 A | 1/1995 | Estrada et al. | |
| 6,531,974 B1 | 3/2003 | Callahan et al. | |
| 7,061,334 B1 | 6/2006 | Baig et al. | |
| 7,348,860 B2 | 3/2008 | Rhee et al. | |
| 7,388,443 B2 | 6/2008 | Baig et al. | |
| 7,429,895 B2 | 9/2008 | Easwaran et al. | |
| 7,728,688 B2 * | 6/2010 | Shor | H03F 3/345 327/156 |
| 8,255,733 B1 | 8/2012 | Bartel et al. | |
| 8,742,815 B2 | 6/2014 | Wadhwa et al. | |
| 8,860,482 B1 * | 10/2014 | Liu | H03L 7/099 327/148 |
| 2013/0002361 A1 * | 1/2013 | Coban | H03K 3/0315 331/57 |
| 2016/0191026 A1 * | 6/2016 | Li | H03K 3/0315 331/57 |
| 2018/0191358 A1 * | 7/2018 | Wang | H03L 7/087 |
| 2018/0212610 A1 * | 7/2018 | Bae | H03L 7/06 |

* cited by examiner

*Primary Examiner* — Joseph Chang
(74) *Attorney, Agent, or Firm* — Crowe & Dunlevy

(57) ABSTRACT

An oscillator circuit powered by a source voltage generates an oscillating output signal. The oscillating output signal is level shifted and applied to a first input of a multiplexer. A second input of the multiplexer receives the oscillating output signal. The multiplexer selects one of the oscillating output signal and the level shifted oscillating output signal for output as a selected oscillating output signal in response to a select signal. A locked loop circuit generates controls a frequency of the oscillating output signal as a function of the selected oscillating output signal and a reference oscillating signal. The select signal further selects one of a reference voltage and the source voltage of the oscillator circuit as an error amplifier reference voltage for a voltage regulator circuit that generates the first power supply voltage.

43 Claims, 5 Drawing Sheets

FREQUENCY SYNTHESIZER WITH DYNAMICALLY SELECTED LEVEL SHIFTING OF THE OSCILLATING OUTPUT SIGNAL

CROSS REFERENCE TO RELATED APPLICATIONS

This application claims the priority benefit of United States Provisional Application for Patent No. 62/777,446 filed Dec. 10, 2018, the disclosure of which is incorporated herein by reference.

TECHNICAL FIELD

The present invention generally relates to a frequency synthesizer and, in particular, to a dynamic selection of a level shifting operation performed on the oscillating output signal from a current controlled oscillator of the frequency synthesizer.

BACKGROUND

Reference is made to FIG. 1 which shows a circuit diagram of a conventional current controlled oscillator (CCO) circuit 10. The CCO circuit 10 includes a ring oscillator 12 formed by an odd number of series-connected inverting delay elements 14(1) to 14(n). An output of one inverting delay element is connected to the input of a next inverting delay element, and a last one of the inverting delay elements 14(n) has its output connected to the input of a first one of the inverting delay elements 14(1). The inverting delay elements 14 are coupled between a source node 18 at a source voltage Vs level and a ground node at a ground voltage level. The level of the source voltage at node 18 is dependent on the threshold voltages of the transistors in the inverting delay elements 14 and the corresponding circuit overdrive. Each inverting delay element 14 provides an amount of delay from input to output which is dependent on a charging current Icharge that is sourced by a current source 30 from a supply voltage Vdd to the source node 18. The oscillation frequency fo of the oscillating output signal 13 (Fout) generated by the ring oscillator is dependent on the amount of delay, and thus the output frequency can be controlled by the charging current Icharge. The oscillation amplitude of the oscillating output signal 13 (Fout) is controlled by the source voltage Vs at node 18.

The magnitude of the charging current Icharge output by the current source 30 is set by a voltage control signal CONT. In an embodiment, a p-channel transistor 32 forms the current source 30, with a source of the transistor 32 connected to the supply voltage Vdd node and a drain of the transistor 32 connected to source the charging current Icharge to the source node 18. The gate of transistor 32 is coupled to receive the voltage control signal CONT. The current source 30 accordingly functions as a voltage-to-current converter circuit. The control signal CONT controls the conductivity of the transistor 32 and hence the magnitude of the charging current Icharge sourced to the source node 18 of the ring oscillator. The voltage magnitude of the control signal CONT is accordingly used to set the oscillation frequency fo of the oscillating output signal 13 Fout.

FIG. 2 shows a block diagram of a frequency synthesizer circuit 50 of a locked loop operating type such as a frequency locked loop (FFL) or phase locked loop (PLL). The circuit 50 includes a controlled oscillator 52 which, in this implementation, is a CCO circuit 10 of the type shown in FIG. 1. The oscillating output signal 13 Fout from the ring oscillator 12 of the controlled oscillator 52 is level shifted by a level shifter circuit 54 and divided by a frequency divider circuit 56 to generate an oscillating feedback signal 15 (Ffb) having a frequency fo/N where N is the divider value (integer or fraction) of the frequency divider circuit 56. Level shifting is needed in the case of the ring oscillator 12 because the oscillating output signal 13 Fout has an oscillation amplitude at the voltage Vs of the source node 18 and it is required that the oscillating feedback signal 15 Ffb instead have an amplitude at the supply voltage Vdd level of the locked loop circuit 50. A phase-frequency detector circuit 60 compares the phase and frequency fo/N of the oscillating feedback signal 15 Ffb to the phase and frequency fr of an oscillating reference signal 17 Fref to generate an error signal ERR indicative of the determined difference in phase-frequency. The error signal ERR is fed to a charge pump (CP) 62 that outputs an equivalent error voltage Verr that is filtered by a filter circuit 64 (for example, of the low pass filter type) to generate the voltage control signal CONT. The control signal CONT, as discussed above in connection with FIG. 1, is applied to the voltage-to-current converter 66 formed by the current source 30 to generate the charging current Icharge which controls the frequency fo of the oscillating output signal 13 Fout. The feedback loop of the frequency synthesizer circuit 50 functions to control the magnitude of the control signal CONT so that the phase and frequency fo/N of the oscillating feedback signal 15 Ffb, which is derived from the oscillating output signal Fout from the ring oscillator 12, is driven to equal the phase and frequency fr of the oscillating reference signal 17 Fref.

In some implementations, circuitry of the frequency synthesizer circuit 50 may be referenced to two different power supply domains. This is shown in FIG. 3. A first power domain has a positive voltage at the Vdda level (primarily used as the supply for analog circuit blocks, and is thus referred to as the analog supply of the locked loop circuit) and a second power domain has a positive voltage at the Vddb level (primarily used as the supply for digital circuit blocks, and is thus referred to as the digital supply of the locked loop circuit). In a typical implementation, Vddb is less than Vdda, but it will be understood that this is just an example. The phase-frequency detector circuit 60, charge pump 62, filter circuit 64 and voltage-to-current converter 66 are powered from the Vdda level of the first power supply domain. The level shifter circuit 54 and frequency divider circuit 56 are powered from the Vddb level of the second power supply domain. A further level shifting circuit 58 receives the oscillating feedback signal 15 Ffb and the oscillating reference signal 17 Fref and functions to level shift those oscillating signals from the Vddb level of the second power supply domain to the Vdda level of the first power supply domain. The level shifter circuit 54 functions to shift the oscillating output signal 13 Fout from the Vs voltage level to the Vddb level of the second power supply domain.

A power management circuit 80 is provided to generate the voltages of the two different power supply domains. From an input supply voltage Vsupply provided, for example, by an off-chip power supply, a reference voltage generator circuit 82, for example, a bandgap reference voltage generator circuit, is used to generate a reference voltage Vref (that may comprise the bandgap voltage Vbg). A first voltage regulator, for example, a low drop out (LDO) type linear voltage regulator 84, generates the Vdda level positive voltage for the first power supply domain from the supply voltage Vsupply and the reference voltage Vref, where Vref is reference voltage for the error amplifier of the regulator. A second voltage regulator, for example, a high drop out (HDO) type linear voltage regulator 86, generates the Vddb level positive voltage for the second power supply domain from the supply voltage Vsupply and the reference voltage Vref, where Vref is the reference voltage for the error amplifier of the regulator. The ground voltages for the first and second power supply domains may be shared in common or be separate. FIG. 4 shows a basic circuit diagram of a conventional a linear regulator circuit of the type used for the voltage regulators 84 and 86 with error amplifier 70 and power transistor 72 powered from the input supply voltage Vsupply and with an input of the error amplifier coupled to receive the reference voltage Vref. The voltage level of the regulated output voltage Vdda or Vddb is set by the resistive divider 74 in the feedback loop for the error amplifier.

Because of the relatively high oscillation frequency fo of the oscillating output signal fout and the large power consumption needed to generate the signal, the level shifter circuit 54 which functions to shift the frequency signal Fout to the Vddb level second power supply domain must be designed for high speed and high power operation. Thus, the level shifter circuit 54 is a significant consumer of current within the frequency synthesizer circuit 50. As the frequency synthesizer circuit 50 may be a component of a device powered by a battery, there is a need in the art address and reduce current consumption. There is an additional challenge in that the digital circuits, such as the level shifter circuit 54, must meet a certain maximum speed requirement even at a lowest possible supply voltage in the slow process corner and the worst case temperature value.

SUMMARY

In an embodiment, a circuit comprises: an oscillator circuit powered at a source voltage and configured to generate an oscillating output signal with an amplitude at a level of the source voltage; a first level shifter circuit powered by a first power supply voltage and configured to level shift the oscillating output signal to generate a level shifted oscillating output signal; a first multiplexer circuit having a first input configured to receive the oscillating output signal and a second input configured to receive the level shifted oscillating output signal, wherein the first multiplexer circuit selects one of the oscillating output signal and the level shifted oscillating output signal for output as a selected oscillating output signal; a locked loop circuit configured to control a frequency of the oscillating output signal as a function of the selected oscillating output signal and a reference oscillating signal; and a first voltage regulator circuit configured to generate the first power supply voltage using the source voltage as an error amplifier reference voltage.

In an embodiment, a circuit comprises: an oscillator circuit powered at a source voltage and configured to generate an oscillating output signal with an amplitude at a level of the source voltage; a divider circuit powered by a first power supply voltage and configured to divide the oscillating output signal to generate a feedback oscillating signal; a phase-frequency comparator powered by a second power supply voltage and configured to compare the feedback oscillating signal to the reference oscillating signal and generate an error signal; a current source circuit configured to generate a current in response to the error signal, wherein the source voltage of the oscillator circuit is generated in response to said current and wherein a frequency of the oscillating output signal is controlled by said current; a first voltage regulator circuit configured to generate the first power supply voltage using the source voltage of the oscillator circuit as a first error amplifier reference voltage; and a second voltage regulator circuit configured to generate the second power supply voltage using a reference voltage as a second error amplifier reference voltage.

In an embodiment, a circuit comprises: an oscillator circuit powered at a source voltage and configured to generate an oscillating output signal with an amplitude at a level of the source voltage; a divider circuit powered by a first power supply voltage and configured to divide the oscillating output signal to generate a feedback oscillating signal; a phase-frequency comparator powered by a second power supply voltage and configured to compare the feedback oscillating signal to the reference oscillating signal and generate an error signal; a current source circuit configured to generate a current in response to the error signal, wherein the source voltage of the oscillator circuit is generated in response to said current and wherein a frequency of the oscillating output signal is controlled by said current; a first multiplexer circuit having a first input configured to receive a reference voltage and a second input configured to receive the source voltage of the oscillator circuit, wherein the second multiplexer circuit selects one of the reference voltage and the source voltage of the oscillator circuit for output as a selected reference voltage; a first voltage regulator circuit configured to generate the first power supply voltage using the selected reference voltage as a first error amplifier reference voltage; and a second voltage regulator circuit configured to generate the second power supply voltage using the reference voltage as a second error amplifier reference voltage.

BRIEF DESCRIPTION OF THE DRAWINGS

For a better understanding of the embodiments, reference will now be made by way of example only to the accompanying figures in which.

DETAILED DESCRIPTION

Figure 2:
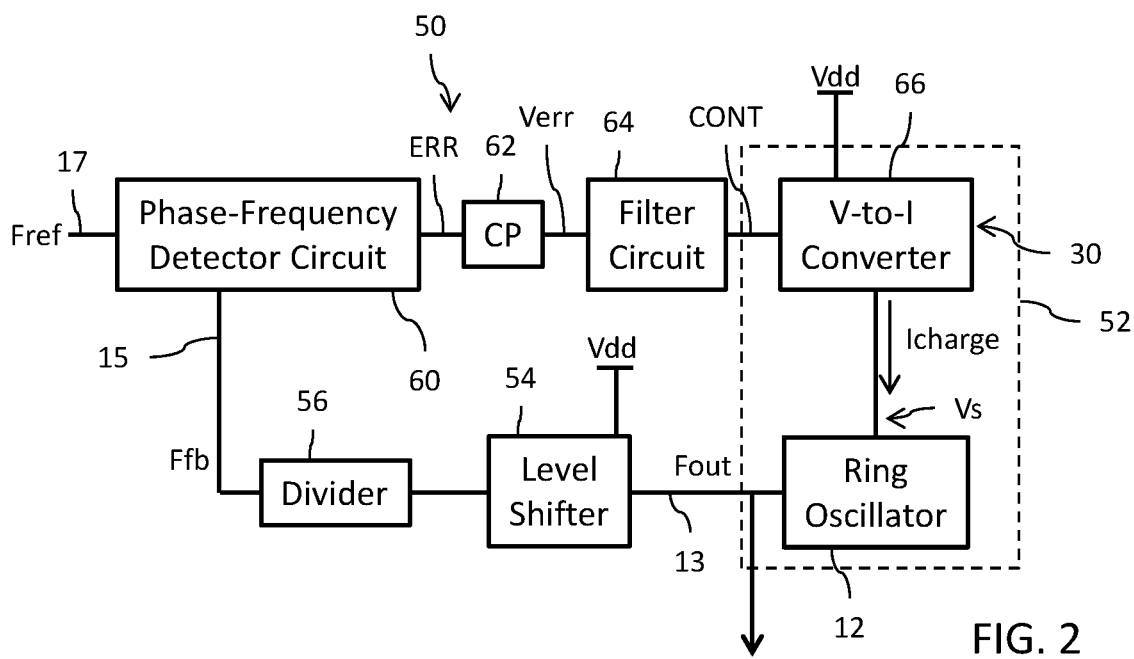
FIG. 2 is a block diagram of a frequency synthesizer circuit of a locked loop operating type.
Figure 3:
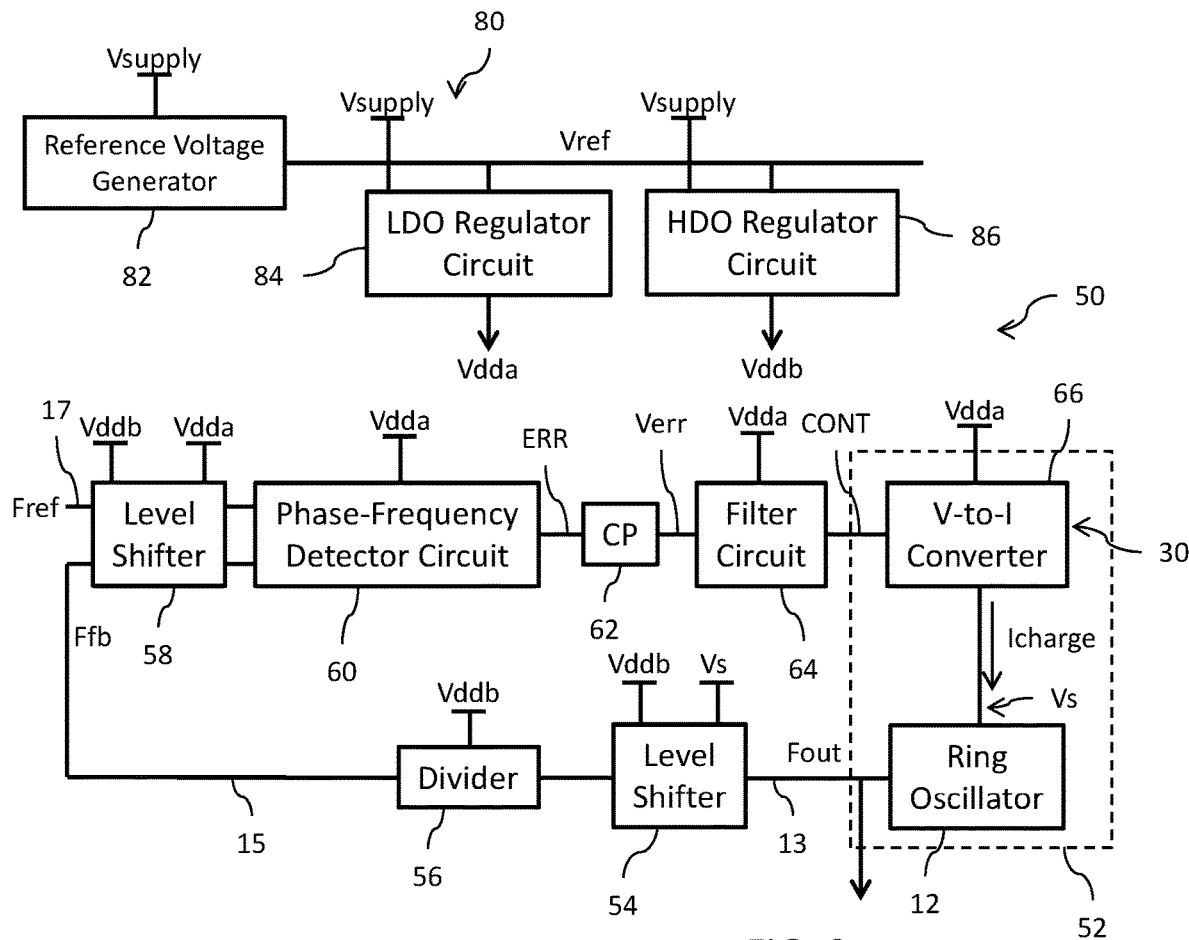
FIG. 3 illustrates the frequency synthesizer circuit using multiple power supply domains.
Figure 5:
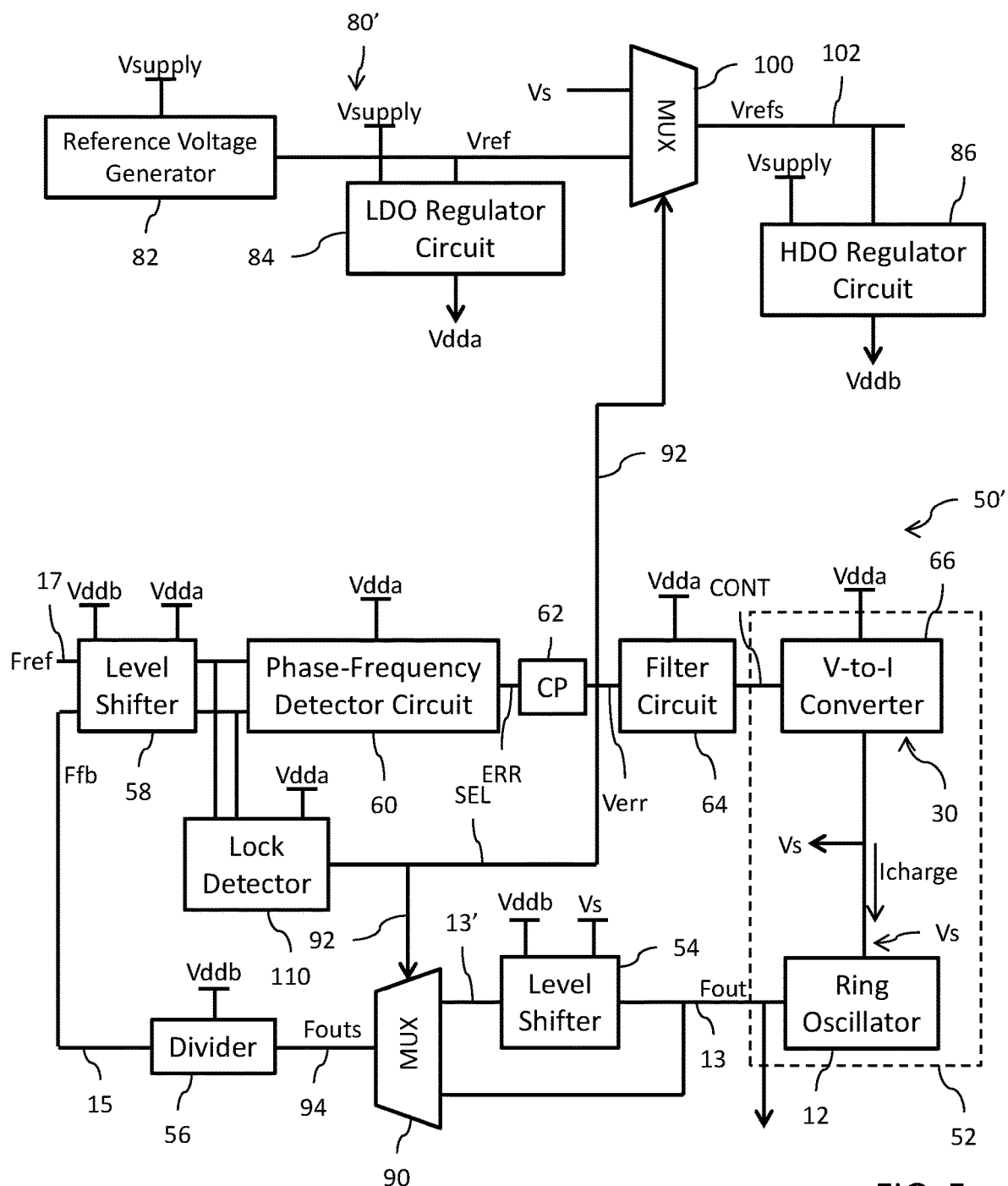
FIGS. 5-7 show block diagrams for embodiments of a frequency synthesizer circuit of a locked loop operating type with a dynamically selected level shifting operation.

Reference is now made to FIG. 5 which shows a block diagram of a frequency synthesizer circuit 50' of a locked loop operating type with a dynamically selected level shifting operation. Like reference numbers refer to like or similar components as shown in FIGS. 2-3.

Figure 1:
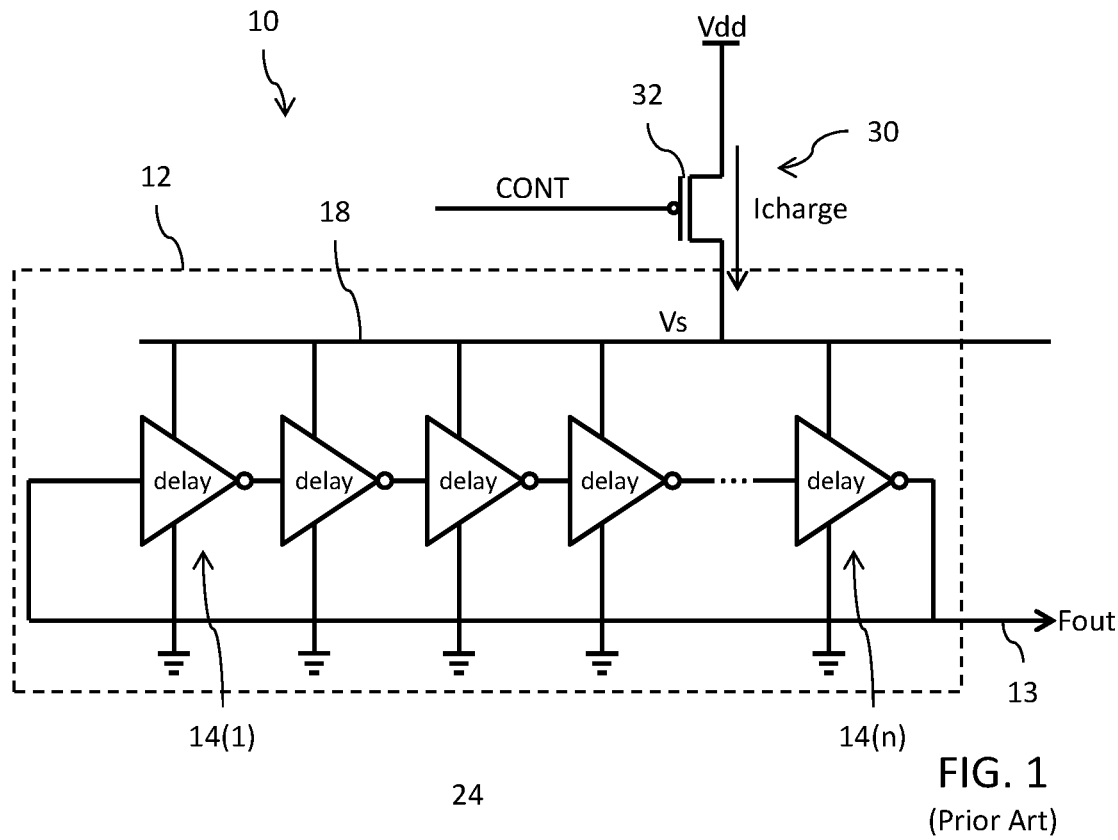
FIG. 1 is a circuit diagram of a conventional current controlled oscillator (CCO) circuit.

The controlled oscillator 52 (comprising, for example, the CCO circuit 10 of the type shown in FIG. 1) includes a ring oscillator 12 that generates the oscillating output signal 13 Fout. The level shifter circuit 54 receives the oscillating output signal 13 Fout, performs a level shifting operation to shift the oscillating output signal Fout from the Vs level to the Vddb level of the second power supply domain and thus produce a level shifted oscillating output signal 13'. A first input of a digital multiplexer 90 is coupled to receive the level shifted oscillating output signal 13' and a second input of the digital multiplexer 90 is coupled to receive the (not level shifted) oscillating output signal 13. A selection signal 92 SEL is connected to a selection input of the digital multiplexer 90. The logic state of the selection signal 92 SEL controls passage by the digital multiplexer 90 of either the level shifted oscillating output signal 13' or the (not level shifted) oscillating output signal 13 to output 94. The level shifted oscillating output signal 13' or the (not level shifted) oscillating output signal 13 that is selected for output 94 is referred to here as the selected oscillating output signal Fouts.

The selected oscillating output signal Fouts at output 94 of the digital multiplexer 90 is divided by the frequency divider circuit 56 to generate the oscillating feedback signal 15 (Ffb) having a frequency fo/N where N is the divider value (integer or fraction) of the frequency divider circuit 56. The level shifting circuit 58 receives the oscillating feedback signal Ffb and the oscillating reference signal 17 Fref and functions to level shift both of those oscillating signals from the Vddb level of the second power supply domain to the Vdda level of the first power supply domain. The phase-frequency detector circuit 60 compares the phase and frequency fo/N of the level shifted oscillating feedback signal 15 Ffb to the phase and frequency fr of the level shifted oscillating reference signal 17 Fref to generate an error signal ERR indicative of the determined difference in phase-frequency. The error signal ERR is converted to an error voltage Verr by a charge pump (CP) 62, and the error voltage Verr is filtered by the filter circuit 64 (for example, of the low pass filter type) to generate the voltage control signal CONT. The control signal CONT is applied to the voltage-to-current converter 66 formed by the current source 30 to generate the charging current Icharge which controls the frequency fo of the oscillating output signal 13 Fout output by the ring oscillator 12 of the controlled oscillator 52. The feedback loop of frequency synthesizer circuit 50' functions to control the magnitude of the control signal CONT so that the phase and frequency fo/N of the oscillating feedback signal 15 Ffb, which is derived from the oscillating output signal 13 Fout from the ring oscillator 12, is driven to equal the phase and frequency fr of the oscillating reference signal 17 Fref.

The first power domain with a positive voltage at the Vdda level powers the phase-frequency detector circuit 60, charge pump 62, filter circuit 64 and voltage-to-current converter 66. The second power domain with a positive voltage at the Vddb level powers the level shifter circuit 54, digital multiplexer 90 and frequency divider circuit 56. The level shifting circuit 58 is powered from both the first and second power supply domains. In this implementation, by example only, Vddb<Vdda.

Figure 4:
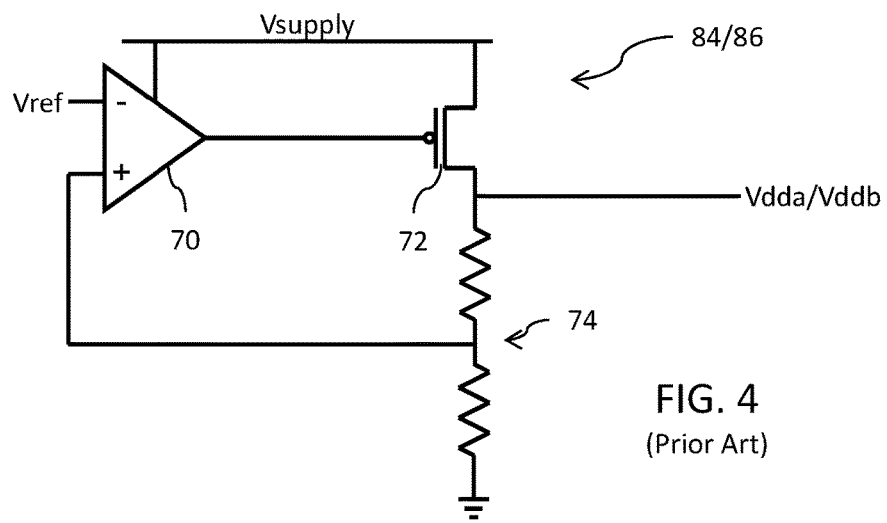
FIG. 4 illustrates a basic circuit diagram of a conventional a linear regulator circuit.

A power management circuit 80' is provided to generate the voltages of the two different power supply domains. From an input supply voltage Vsupply provided, for example, by an off-chip power supply, the reference voltage generator circuit 82, for example, a bandgap reference voltage generator circuit, generates the reference supply voltage Vref (for example having the bandgap voltage Vbg level). The first voltage regulator, for example, a low drop out (LDO) type linear voltage regulator 84, generates the Vdda level positive voltage for the first power supply domain from the supply voltage Vsupply and the reference voltage Vref, where Vref provides the reference voltage for the error amplifier 70 of the regulator (see, FIG. 4). A first input of an analog multiplexer 100 is coupled to receive the reference voltage Vref and a second input of the analog multiplexer 100 is coupled to receive the source voltage Vs (or a scaled down version of the source voltage Vs) from node 18 of the ring oscillator 12. The selection signal 92 SEL is connected to a selection input of the analog multiplexer 100. The logic state of the selection signal 92 SEL controls passage by the analog multiplexer 100 of either the reference voltage Vref or the source voltage Vs to output 102 (for use as the reference voltage of the second voltage regulator circuit). The reference voltage Vref or the source voltage Vs passed by the analog multiplexer 100 is referred to here as the selected reference voltage Vrefs. The second voltage regulator, for example, a high drop out (HDO) type linear voltage regulator 86, generates the Vddb level positive voltage for the second power supply domain from the supply voltage Vsupply and the selected reference voltage Vrefs, where Vrefs is used as the reference voltage for the error amplifier 70 of the regulator (FIG. 4). The ground voltages for the first and second power supply domains may be shared in common or be separate.

With the selection signal 92 SEL in a first logic state, the digital multiplexer 90 selects the level shifted oscillating output signal 13' for the output 94 as the selected oscillating output signal Fouts and the analog multiplexer 100 selects the reference voltage Vref output by the reference voltage generator circuit 82 for the output 102 as the selected reference voltage Vrefs for the second voltage regulator 86. Conversely, with the selection signal 92 SEL in a second logic state, the digital multiplexer 90 selects the (not level shifted) oscillating output signal 13 for the output 94 as the selected oscillating output signal Fouts and the analog multiplexer 100 selects the source voltage Vs of the ring oscillator 12 for the output 102 as the selected reference voltage Vrefs for the second voltage regulator 86.

During start-up of the frequency synthesizer circuit 50', the oscillation frequency fo of the oscillating output signal Fout will be relatively slow due to the relatively low magnitude of the charging current Icharge. Here, it is noted that it takes time for the voltage control signal CONT to build up (this time being dependent on the bandwidth of the locked loop circuit and the current of the charge pump). Level shifting of the oscillating output signal Fout to the Vddb level of the second power supply domain is critical to ensure proper acquisition of frequency lock and further ensure that the source voltage Vs of the oscillator is at a sufficient amplitude to be used to power digital circuitry. So, the selection signal 92 SEL is set in the first logic state so that the digital multiplexer 90 selects the level shifted oscillating output signal 13' for the output 94 as the selected oscillating output signal Fouts. At the same time, with the selection signal 92 SEL set in the first logic state, the reference voltage Vref output by the reference voltage generator circuit 82 is selected by the analog multiplexer 100 as the selected reference voltage Vrefs. The Vddb level of the second power supply domain is thus generated by the second voltage regulator 86 using the reference voltage Vref as the error amplifier reference voltage (see, FIG. 4).

After expiration of a period time needed for the source voltage Vs level to increase and for the oscillation frequency fo of the oscillating output signal Fout to increase, the selection signal 92 SEL is switched to the second logic state. The digital multiplexer 90 now instead selects the (not level shifted) oscillating output signal 13 for the output 94 as the selected oscillating output signal Fouts. The analog multiplexer 100 now instead selects the source voltage Vs as the selected reference voltage Vrefs. The Vddb level of the second power supply domain is thus generated by the second voltage regulator 86 using the source voltage Vs as the error amplifier reference voltage (see, FIG. 4).

Importantly, the source voltage Vs inherently possesses information about Process, Temperature and Frequency of Oscillation for the ring oscillator 12 which is automatically transferred to the Vddb level of the second power supply domain when the analog multiplexer 100 selects the source voltage Vs as the selected reference voltage Vrefs for the error amplifier of the second voltage regulator 86.

The selection signal 92 SEL can be generated by any suitable control circuit. In the implementation shown in FIG. 5, the selection signal 92 SEL is generated by a lock detection circuit 110 which senses the level shifted oscillating feedback signal 15 Ffb and the level shifted oscillating reference signal 17 Fref. These signals are compared by the lock detection circuit 110 to determine a degree to which the level shifted oscillating feedback signal 15 Ffb is locked to the level shifted oscillating reference signal 17 Fref. When that degree exceeds a threshold, the lock detection circuit 110 switches the selection signal 92 SEL from the first logic state to the second logic state. As an example, it is known in locked loop type circuits to have a coarse lock and/or a fine lock detector. One of these lock detectors could be further used to generate the selection signal 92 SEL. For example, the switch from the first logic state to the second logic state may occur when coarse lock is achieved.

Figure 6:
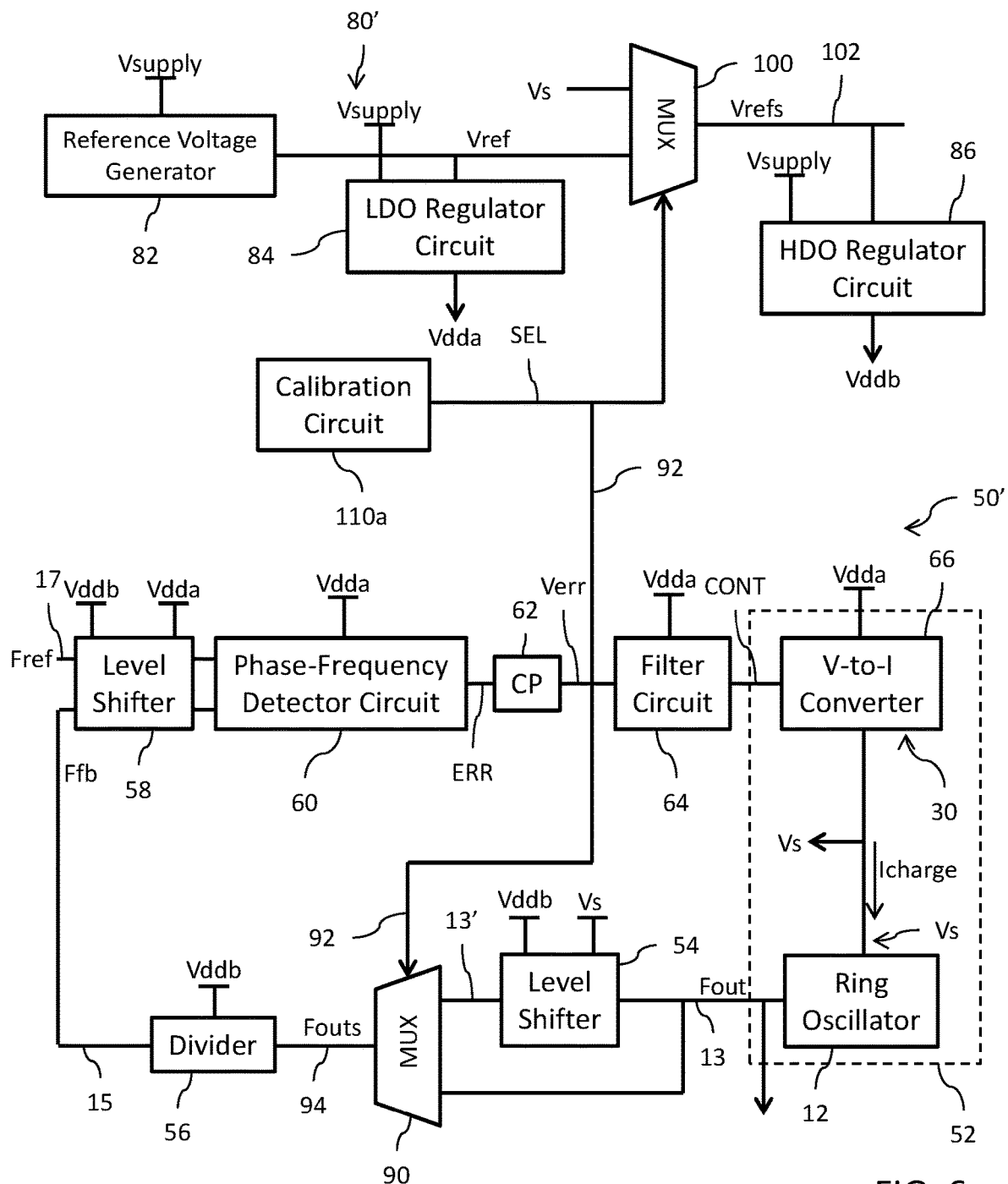

In another implementation, the control circuit for generating the selection signal 92 SEL may be a calibration circuit 110a (see, FIG. 6). During a calibration mode, the calibration circuit 110b sets the selection signal 92 SEL in the first logic state. When calibration is completed, the calibration circuit 110a switches the selection signal 92 SEL to the second logic state.

Figure 7:
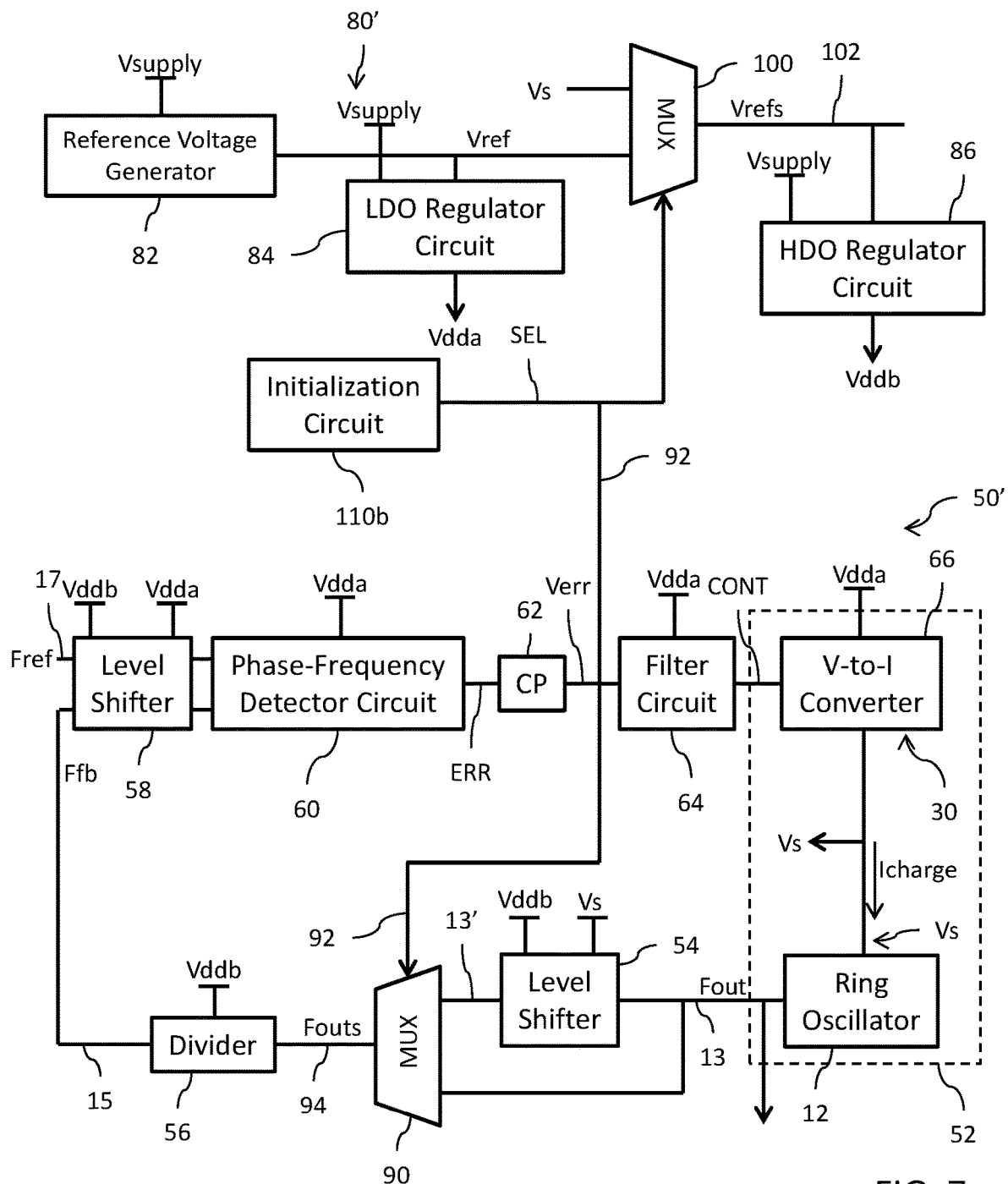

In another implementation, the control circuit for generating the selection signal 92 SEL may be an open loop initialization circuit 110b (see, FIG. 7). During initialization of the frequency synthesizer circuit 50', the circuit 110b sets the selection signal 92 SEL in the first logic state. When initialization is completed, the circuit 110b switches the selection signal 92 SEL to the second logic state.

An advantage of the implementations shown in FIGS. 5-7 is to remove the high speed level shifter 54 from the feedback loop when it is not needed. The level shifter 54 consumes a significant amount of current as it operates at maximum speed and also as the phases are non-differential from the ring oscillator. In an implementation, the level shifter 54 is disabled when the multiplexer 90 is controlled to select the not level shifted Fout signal.

A main benefit of the implementations shown in FIGS. 5-7 is that the technique disclosed automatically tracks Process, Temperature and Frequency of Oscillation. For example, if process is fast, automatically, the supply will be low, thus saving current and power consumption in the divider, level shifter, etc. Similarly, depending on voltage (whether mobility or threshold effect dominates), voltage will be lower at minimum or maximum temperature. If the oscillator is at minimum oscillating frequency, the voltage will be at minimum and it will automatically be higher if the frequency of oscillation increases. This will greatly reduce the possibility of functional failure. Furthermore, it is noted that the divider operates at a very high speed as it directly works on the frequency of the oscillator output signal Fout. It is a standard practice to use high speed true single phase clocking (TSPC) flip-flops in the divider to achieve high frequency operation. Since the supply of the divider now tracks process, temperature and frequency of oscillation, the divider is easier to design.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A circuit, comprising:
an oscillator circuit powered at a source voltage and configured to generate an oscillating output signal with an amplitude at a level of the source voltage;
a first level shifter circuit powered by a first power supply voltage and configured to level shift the oscillating output signal to generate a level shifted oscillating output signal;
a first multiplexer circuit having a first input configured to receive the oscillating output signal and a second input configured to receive the level shifted oscillating output signal, wherein the first multiplexer circuit selects one of the oscillating output signal and the level shifted oscillating output signal for output as a selected oscillating output signal;
a locked loop circuit configured to control a frequency of the oscillating output signal as a function of the selected oscillating output signal and a reference oscillating signal; and
a first voltage regulator circuit configured to generate the first power supply voltage using the source voltage as an error amplifier reference voltage.

2. The circuit of claim 1, wherein the locked loop circuit comprises:
a divider circuit configured to divide the selected oscillating output signal to generate a feedback oscillating signal; and
a phase-frequency comparator configured to compare the feedback oscillating signal to the reference oscillating signal and generate an error signal;
wherein the frequency of the oscillating output signal is set as a function of the error signal.

3. The circuit of claim 2, wherein the divider circuit is powered by the first power supply voltage and wherein the phase-frequency comparator is powered by a second power supply voltage, the first power supply voltage being less than the second power supply voltage.

4. The circuit of claim 3, further comprising a second voltage regulator circuit configured to generate the second power supply voltage using a reference voltage as an error amplifier reference voltage.

5. The circuit of claim 4, wherein the reference voltage is a bandgap voltage.

6. The circuit of claim 4, further comprising a second multiplexer circuit having a first input configured to receive the reference voltage and a second input configured to receive the source voltage of the oscillator circuit, wherein the second multiplexer circuit selects one of the reference voltage and the source voltage of the oscillator circuit for output as the error amplifier reference voltage of the first voltage regulator circuit.

7. The circuit of claim 6, further comprising a control circuit configured to generate a selection signal applied to selection inputs of the first and second multiplexer circuits, said selection signal having:
a first logic state for causing the first multiplexer circuit to select the level shifted oscillating output signal and causing the second multiplexer circuit to simultaneously select the reference voltage; and
a second logic state for causing the first multiplexer circuit to select the oscillating output signal and causing the second multiplexer circuit to simultaneously select the source voltage.

8. The circuit of claim 7, wherein the control circuit comprises a lock detect circuit which causes the selection signal to transition from the first logic state to the second logic state in response to detection of a lock condition of the output oscillating signal.

9. The circuit of claim 8, wherein the lock condition is a coarse lock of phase-frequency between the feedback oscillating signal and the reference oscillating signal.

10. The circuit of claim 7, wherein the control circuit comprises a calibration circuit which causes the selection signal to transition from the first logic state to the second logic state in response to completion of a calibration operation.

11. The circuit of claim 7, wherein the control circuit comprises an initialization circuit which causes the selection signal to transition from the first logic state to the second logic state in response to completion of an initialization operation.

12. The circuit of claim 11, wherein the initialization operation is a start-up operation.

13. The circuit of claim 3, further comprising a second level shifter configured to level shift the feedback oscillating signal from the first power supply voltage to the second power supply voltage.

14. The circuit of claim 3, further comprising a voltage-to-current conversion circuit configured to convert a control voltage derived from the error signal to a current from which the source voltage of the oscillator circuit is generated.

15. The circuit of claim 14, wherein the voltage-to-current conversion circuit is powered from the second power supply voltage.

16. The circuit of claim 1, wherein the error amplifier reference voltage is scaled from the source voltage.

17. A circuit, comprising:
an oscillator circuit powered at a source voltage and configured to generate an oscillating output signal with an amplitude at a level of the source voltage;
a divider circuit powered by a first power supply voltage and configured to divide the oscillating output signal to generate a feedback oscillating signal;
a phase-frequency comparator powered by a second power supply voltage and configured to compare the feedback oscillating signal to the reference oscillating signal and generate an error signal;
a current source circuit configured to generate a current in response to the error signal, wherein the source voltage of the oscillator circuit is generated in response to said current and wherein a frequency of the oscillating output signal is controlled by said current;
a first voltage regulator circuit configured to generate the first power supply voltage using the source voltage of the oscillator circuit as a first error amplifier reference voltage; and
a second voltage regulator circuit configured to generate the second power supply voltage using a reference voltage as a second error amplifier reference voltage.

18. The circuit of claim 17, wherein the current source circuit is powered from the second power supply voltage.

19. The circuit of claim 17, wherein the reference voltage is a bandgap voltage.

20. The circuit of claim 17, further comprising:
a first level shifter circuit powered by the first power supply voltage and configured to level shift the oscillating output signal to generate a level shifted oscillating output signal; and
a first multiplexer circuit having a first input configured to receive the oscillating output signal and a second input configured to receive the level shifted oscillating output signal, wherein the first multiplexer circuit selects one of the oscillating output signal and the level shifted oscillating output signal for output as a selected oscillating output signal from which the divider circuit generates the feedback oscillating signal.

21. The circuit of claim 17, further comprising a control circuit configured to generate a selection signal applied to a selection input of the first multiplexer circuit, said selection signal having:
a first logic state for causing the first multiplexer circuit to select the level shifted oscillating output signal; and
a second logic state for causing the first multiplexer circuit to select the oscillating output signal.

22. The circuit of claim 21, wherein the control circuit comprises a lock detect circuit which causes the selection signal to transition from the first logic state to the second logic state in response to detection of a lock condition of the oscillating output signal.

23. The circuit of claim 22, wherein the lock condition is a coarse lock of phase-frequency between the feedback oscillating signal and the reference oscillating signal.

24. The circuit of claim 21, wherein the control circuit comprises a calibration circuit which causes the selection signal to transition from the first logic state to the second logic state in response to completion of a calibration operation.

25. The circuit of claim 21, wherein the control circuit comprises an initialization circuit which causes the selection signal to transition from the first logic state to the second logic state in response to completion of an initialization operation.

26. The circuit of claim 25, wherein the initialization operation is a start-up operation.

27. The circuit of claim 17, further comprising a second multiplexer circuit having a first input configured to receive the reference voltage and a second input configured to receive the source voltage of the oscillator circuit, wherein the second multiplexer circuit selects one of the reference voltage and the source voltage of the oscillator circuit for output as the first error amplifier reference voltage of the first voltage regulator circuit.

28. The circuit of claim 27, further comprising a control circuit configured to generate a selection signal applied to a selection input of the second multiplexer circuit, said selection signal having:
a first logic state for causing the second multiplexer circuit to select the reference voltage; and
a second logic state for causing the second multiplexer circuit to select the source voltage.

29. The circuit of claim 28, wherein the control circuit comprises a lock detect circuit which causes the selection signal to transition from the first logic state to the second logic state in response to detection of a lock condition.

30. The circuit of claim 29, wherein the lock condition is a coarse lock of phase-frequency between the feedback oscillating signal and the reference oscillating signal.

31. The circuit of claim 28, wherein the control circuit comprises a calibration circuit which causes the selection signal to transition from the first logic state to the second logic state in response to completion of a calibration operation.

32. The circuit of claim 28, wherein the control circuit comprises an initialization circuit which causes the selection signal to transition from the first logic state to the second logic state in response to completion of an initialization operation.

33. The circuit of claim 32, wherein the initialization operation is a start-up operation.

34. The circuit of claim 17, wherein the first error amplifier reference voltage is scaled from the source voltage.

35. A circuit, comprising:
an oscillator circuit powered at a source voltage and configured to generate an oscillating output signal with an amplitude at a level of the source voltage;
a divider circuit powered by a first power supply voltage and configured to divide the oscillating output signal to generate a feedback oscillating signal;
a phase-frequency comparator powered by a second power supply voltage and configured to compare the feedback oscillating signal to the reference oscillating signal and generate an error signal;
a current source circuit configured to generate a current in response to the error signal, wherein the source voltage of the oscillator circuit is generated in response to said current and wherein a frequency of the oscillating output signal is controlled by said current;
a first multiplexer circuit having a first input configured to receive a reference voltage and a second input configured to receive the source voltage of the oscillator circuit, wherein the first multiplexer circuit selects one of the reference voltage and the source voltage of the oscillator circuit for output as a selected reference voltage;
a first voltage regulator circuit configured to generate the first power supply voltage using the selected reference voltage as a first error amplifier reference voltage; and
a second voltage regulator circuit configured to generate the second power supply voltage using the reference voltage as a second error amplifier reference voltage.

36. The circuit of claim 35, wherein the current source circuit is powered from the second power supply voltage.

37. The circuit of claim 35, wherein the reference voltage is a bandgap voltage.

38. The circuit of claim 35, further comprising a control circuit configured to generate a selection signal applied to a selection input of the first multiplexer circuit, said selection signal having:
a first logic state for causing the first multiplexer circuit to select the reference voltage; and
a second logic state for causing the first multiplexer circuit to select the source voltage.

39. The circuit of claim 35, further comprising:
a level shifter circuit powered by the first power supply voltage and configured to level shift the oscillating output signal to generate a level shifted oscillating output signal; and
a second multiplexer circuit having a first input configured to receive the oscillating output signal and a second input configured to receive the level shifted oscillating output signal, wherein the second multiplexer circuit selects one of the oscillating output signal and the level shifted oscillating output signal for output as a selected oscillating output signal from which the divider circuit generates the feedback oscillating signal.

40. The circuit of claim 39, further comprising a control circuit configured to generate a selection signal applied to selection inputs of the first and second multiplexer circuits, said selection signal having:
a first logic state for causing the first multiplexer circuit to select the reference voltage and causing the second multiplexer circuit to simultaneously select the level shifted oscillating output signal; and
a second logic state for causing the first multiplexer circuit to select the source voltage and causing the second multiplexer circuit to simultaneously select the oscillating output signal.

41. The circuit of claim 40, wherein the control circuit comprises a lock detect circuit which causes the selection signal to transition from the first logic state to the second logic state in response to detection of a lock condition.

42. The circuit of claim 40, wherein the control circuit comprises a calibration circuit which causes the selection signal to transition from the first logic state to the second logic state in response to completion of a calibration operation.

43. The circuit of claim 40, wherein the control circuit comprises an initialization circuit which causes the selection signal to transition from the first logic state to the second logic state in response to completion of an initialization operation.

* * * * *